United States Patent [19]

Drori et al.

[11] Patent Number: 5,084,667
[45] Date of Patent: Jan. 28, 1992

[54] NONVOLATILE NONLINEAR PROGRAMMABLE ELECTRONIC POTENTIOMETER

[75] Inventors: Joseph Drori, San Jose; William S. Jennings Check, Orangevale; William H. Owen, III, Los Altos Hills, all of Calif.

[73] Assignee: Xicor, Inc., Milpitas, Calif.

[21] Appl. No.: 462,311

[22] Filed: Dec. 22, 1989

Related U.S. Application Data

[63] Continuation of Ser. No. 54,584, May 26, 1987, abandoned, which is a continuation-in-part of Ser. No. 759,599, Jul. 26, 1985, Pat. No. 4,668,932.

[51] Int. Cl.⁵ .................................................. G05F 1/12
[52] U.S. Cl. .................................. 323/298; 323/354; 365/228
[58] Field of Search .............. 323/293, 297, 298, 352, 323/353, 354; 365/45, 46, 228; 338/306, 307

[56] References Cited

U.S. PATENT DOCUMENTS

| | | | |
|---|---|---|---|
| 3,812,478 | 5/1974 | Tomisawa et al. | 365/46 |
| 4,157,494 | 6/1979 | Kornienko et al. | 323/354 |
| 4,227,663 | 10/1980 | Ramsey et al. | 244/149 |
| 4,238,724 | 12/1980 | Klaus et al. | 323/354 |
| 4,247,913 | 1/1981 | Hiniker et al. | 365/228 |
| 4,271,486 | 6/1981 | Dagostino et al. | 365/45 |
| 4,458,307 | 7/1984 | McAnlis et al. | 364/200 |
| 4,468,607 | 8/1984 | Tanaka et al. | 323/354 |
| 4,673,866 | 6/1987 | Masuda | 323/298 X |

FOREIGN PATENT DOCUMENTS

| | | | |
|---|---|---|---|
| 0046411 | 3/1985 | Japan | 365/228 |
| 2091918 | 8/1982 | United Kingdom . | |
| 8001632 | 8/1980 | World Int. Prop. O. . | |
| 8700710 | 1/1987 | World Int. Prop. O. . | |

OTHER PUBLICATIONS

Koch, Electronic Products Magazine, "Nonvolatile Static RAM Snapshots Data into EEPROM", 12/80, 75.

Primary Examiner—Steven L. Stephan
Assistant Examiner—Kristine Peckman
Attorney, Agent, or Firm—McCubbrey, Bartels, Meyer & Ward

[57] ABSTRACT

A variable impedance circuit for use in an external circuit is disclosed. The impedance value is selected by an external circuit. The variable impedance is generated between two terminals which are accessible for connection to external circuitry. The impedance provided between these terminals is determined by a control circuit responsive to electrical signals coupled to the control circuit. An internal register in the control circuit stores a value which specifies the impedance between the two terminals. The stored value is copied into a programmable nonvolatile read-only memory in response to a first predetermined electrical signal. Similarly, the value stored in the read-only memory is selectively copied into the internal control circuit register in response to a second predetermined electrical signal. A number of embodiments of variable impedance elements are disclosed which minimize the number of separate resistors required to achieve the equivalent resolution achievable using a series arrangement of resistors.

18 Claims, 10 Drawing Sheets

NONVOLATILE NONLINEAR PROGRAMMABLE ELECTRONIC POTENTIOMETER

This application is a continuation, of application Ser. No. 054,584 filed May 26, 1987 abandoned. which is a Continuation-in-Part of our co-pending U S. patent application Ser. No. 759,599 filed 7/26/85 now U.S. Pat. No. 4,668,932.

The present invention relates generally to the field of variable impedance elements and more specifically to the field of programmable variable impedance elements for use in electrical circuits.

Electronic circuits containing variable impedance elements are well known to the art. These variable impedance elements are usually in the form of variable resistors, also called potentiometers. However, circuits using variable inductors or capacitors are also well known. These variable impedance elements are usually manually adjusted to provide a selected impedance so as to affect some aspect of the circuit in which they are located. For example, a potentiometer may be set to a value which maximizes a signal generated at a node in a given circuit.

Manual adjustment of potentiometers is usually unsatisfactory in circuits under the control of data processing systems or other external electric circuits where ongoing adjustment of the potentiometer is necessary for circuit operation. The data processing system often must change the value of the variable impedance element in a time that is short relative to the time required to complete a manual adjustment of the variable impedance element. Manual adjustment also requires the presence of a human operator which is impractical in many situations in which variable impedance elements are employed.

Potentiometers which are adjusted mechanically by motors or other actuators under external control are also known to the prior art. Although these potentiometers relieve the need for an operator, they are still unsatisfactory in many applications. First, the time to make an adjustment is still too long for many applications. Second, the long term reliability of such electromechanical devices is not sufficient for many applications requiring variable impedance elements. Finally, such systems are often economically unattractive.

Special purpose integrated circuit variable impedance elements which allow the level of attenuation to be adjusted under the digital control of an external data processing system are known to the prior art. For example, Tanaka, et al., U.S. Pat. No. 4,468,607, teaches a ladder attenuator which is controlled by a binary number by means of a switch circuit. Depending on the state of the switches in this switch circuit, one or more stages of attenuation are introduced into the signal path.

These prior art variable attenuation integrated circuits have no ability to store the selected attenuation value when power is removed from the circuit, and consequently no ability to automatically reestablish the same attenuation value once power is restored. Hence, either battery backup was required for the circuit, or an external means for reinitializing these variable impedance element attenuation values was required when power was returned to the attenuation circuit. This increased the complexity of the circuits containing such variable impedance elements. It also could result in damage to the circuit containing the variable impedance element if the impedance specified by said variable impedance element at power-up was not compatible with other parameters of the external circuit in question.

Although nonvolatile electrically erasable integrated circuit memories have been used in prior art systems to preset counters, for example, or to preset a potentiometer when power is first applied to a circuit, no circuit is known which combines the ability to selectively access a node in a variable potentiometer and to store the identity of that selected node in a non-volatile memory in response to a predetermined signal, e.g. the removal of a chip select signal, or the loss of power, for later enabling the circuit to reaccess the selected node once power has been restored.

The above cited co-pending application describes a variable impedance integrated circuit comprising a plurality of two terminal impedance elements connected in series which automatically retains a selected attenuation value when power is removed from the impedance circuit. This impedance circuit includes a means for restoring the stored attenuation value when power is returned to the circuit, thereby overcoming the above described limitations of the prior art variable impedance devices. More specifically, a node is provided between each pair of impedance elements in the series chain. At least one of the first and last elements in the series chain is connected to an externally accessible terminal. Means are provided for accessing the selected node and for connecting this selected node to another externally accessible terminal. An electrically reprogrammable read-only memory stores the identity of the selected node such that the identity of this node is retained when power is removed from the circuit. When power is returned to the circuit, the node which was previously connected to said terminal is automatically reconnected.

Although this variable impedance circuit represents a significant advance over the prior art devices described above, there are a number of applications in which the number of impedance elements which must be included in the series impedance is too large. For example, if the impedance must be varied in small steps over a large range of values, a very large number of two terminal impedance elements must be used. To vary the impedance in one ohm steps over a range of 1000 ohms, a thousand one ohm resistors would be required.

Accordingly, it is an object of the present invention to provide an improved variable impedance circuit.

It is a further object of the present invention to provide a variable impedance circuit wherein the number of fixed impedance elements used to construct said impedance circuit is much less than the range of impedances provided by said impedance circuit divided by the minimum incremental change in impedance which is provided by said variable impedance circuit.

These and other objects of the invention will be apparent from the following detailed description and the accompanying drawings.

SUMMARY OF THE INVENTION

The present invention consists of a general purpose variable impedance circuit which may be used in place of a center-tapped potentiometer in a circuit under the control of a data processing system or other external circuit. A variable impedance circuit according to the present invention includes a variable impedance network which sets the impedance between two terminals which are accessible for connection to external circuitry. The impedance provided between these terminals is determined by a control circuit which is coupled to the data processing system or other external circuit. The impedance in question is specified by electrical signals coupled to the control circuit. An internal register in the control circuit stores a value which specifies the impedance between the two terminals. The stored value may be copied into a programmable nonvolatile read-only memory in response to a predetermined electrical signal. Similarly, the value stored in the read-only memory may be copied into the internal control circuit register in response to a second predetermined electrical signal which is preferably generated when power is first applied to the present invention. In the preferred embodiment, the control circuit is a counter which may be incremented or decremented in response to signals from the data processing system or other external circuit.

A number of embodiments of variable impedance elements can be used according to the present invention to minimize the number of separate resistors required to achieve the equivalent resolution as a series arrangement of resistors. Preferred embodiments of such variable impedance elements include a linear series/parallel array for enabling coarse and fine adjustment of variable impedance, a binary weighted configuration constructed by placing two parallel resistor networks in series, an embodiment where fixed resistors are placed in parallel with the variable impedance circuit for obtaining non-linear or tapered resistance characteristics, and a binary weighted array of resistors connected in a 1R-2R configuration.

DETAILED DESCRIPTION OF THE INVENTION

The present invention consists of a variable impedance circuit for incorporation into electronic circuits in place of a potentiometer or similar mechanical variable impedance element. The present invention allows the impedance of the impedance circuit to be set by electrical signals sent thereto. Once set, the present invention stores the impedance value in a programmable nonvolatile read only memory. When power is removed from the present invention, the last impedance value remains stored in the programmable read only memory. When power is restored to the present invention, this stored impedance value is reestablished.

Figure 1:
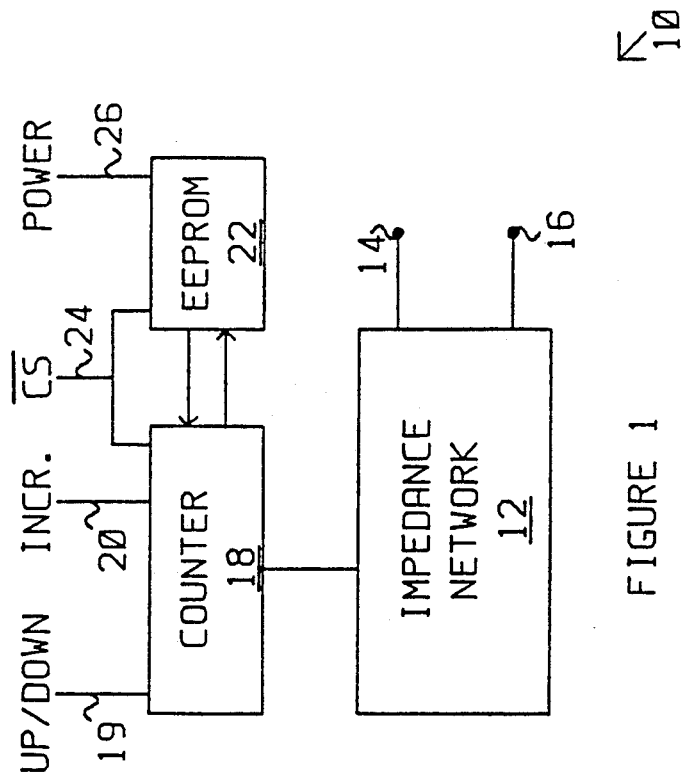
FIG. 1 is block diagram of a variable impedance circuit according to the present invention.

The operation of an impedance circuit according to the present invention may be most easily understood with reference to FIG. 1 which is a block diagram of the preferred embodiment of the present invention. The variable impedance circuit 10 consists of an impedance network 12 which consists of a number of fixed impedance elements and switches. The switches are used to connect various combinations of impedance elements between two terminals 14 and 16. The particular combination is determined by a value stored in a control circuit which is preferably a counter 18. The count stored in counter 18 may be altered by signals on two lines 19 and 20. The UP/DOWN signal on line 19 determines whether the counter will be incremented or decremented by a predetermined amount in response to an increment (INCR.) signal on line 20.

The value stored in the counter 18 may be transferred to a programmable nonvolatile read only memory (EEPROM) 22 in response to specified voltage transitions on a third signal line 24 which is referred to as chip select (CS) line 24 in the preferred embodiment. Chip select line 24 also enables counter 18. When the chip select line 24 is low, counter 18 will respond to signals on lines 19 and 20. This enables the circuit controlling the variable impedance element 10 to alter the value stored in counter 18. That is, the circuit controlling the present invention causes chip select line 24 to go low. It then couples the appropriate signals to counter 18 on lines 19 and 20 to cause the value stored in counter 18 to change to the new desired value.

During this updating process, the value stored in programmable read only memory 22 is not changed. Electrically programmable read only memories may be written only a limited number of times, typically a few thousands of times. Further, the time needed to write a value into a programmable read only memory is much longer than the time needed to increment counter 18. If the value stored in programmable read only memory 22 were changed each time the value stored in counter 18 was incremented, the limited lifetime of programmable read only memory 22 would lead to the failure of the device. In addition, the time needed to write a value into programmable read only memory 22 would reduce the response time of counter 18. Hence, the value stored in programmable read only memory 22 is preferably only updated when the value stored in counter 18 reaches its final value. This is preferably signaled by a voltage transition from low to high on chip select line 24.

A voltage transition on a fourth signal line 26 is used to signal the transfer of the value stored in programmable read only memory 22 to counter 18. When a voltage transition from low to high is detected on line 26, the value stored in programmable read only memory 22 is transferred to counter 18. Line 26 is preferably coupled to a power supply terminal (POWER) so that the value stored in programmable read only memory 22 will automatically be loaded into counter 18 when power is applied to variable impedance circuit 10. This guarantees that the last value stored in counter 18 before power was removed from variable impedance circuit 10 will be restored when power is once again applied to variable impedance circuit 10.

It will be apparent to those skilled in the art that counter 18 may be replaced by any other storage register which may be updated by appropriate electrical signals. It will also be apparent that impedance network 12 may have more than two terminals. For example, impedance networks having three terminals are useful in simulating a standard potentiometer.

Figure 2:
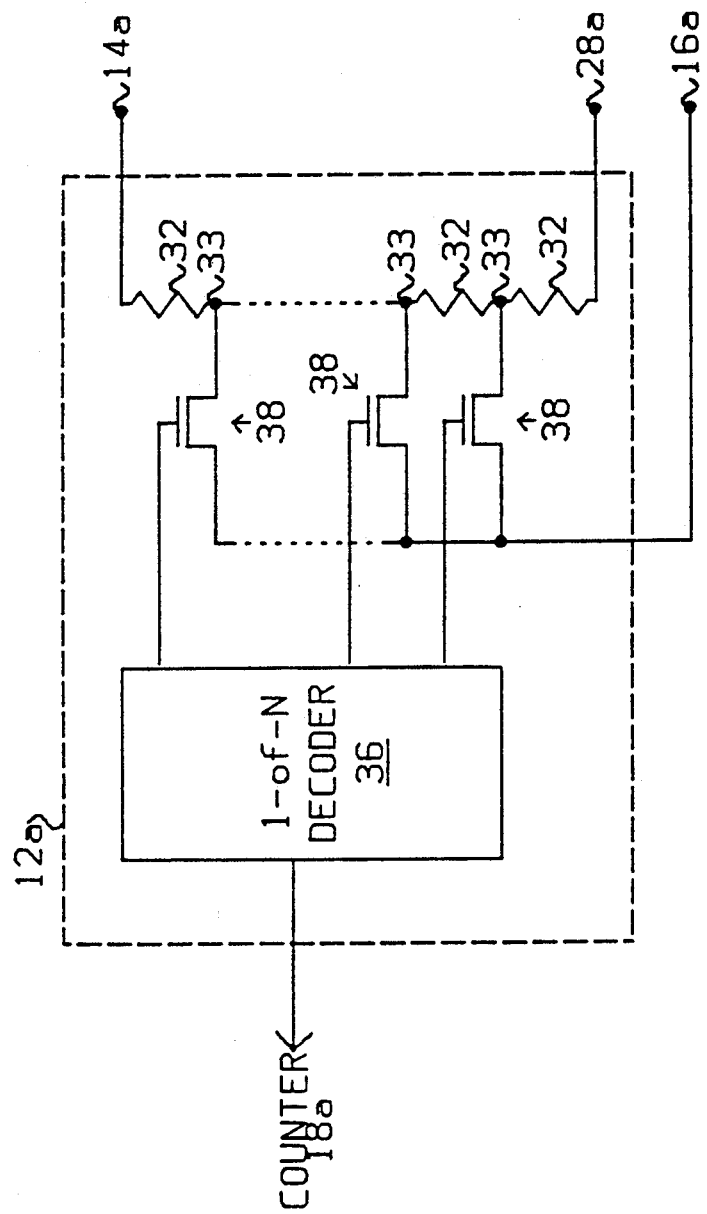
FIG. 2 is a schematic diagram of a variable impedance circuit in which the impedance network comprises a plurality of impedance elements in series.

The details of impedance network 12 will, in general, depend on the desired relationship between the value stored in counter 18 and the impedance to be generated between terminals 14 and 16. For example, in co-pending patent application Ser. No. 759,599 now U.S. Pat. No. 4,668,932 an impedance network in which the impedance between terminals 14 and 16 is a linear function of the value stored in counter 18 is described. This impedance network is shown in FIG. 2 at 12a.

In contrast to the impedance network shown in FIG. 1, impedance network 12a has three external terminals, 14a, 16a, and 28a. Impedance network 12a simulates a standard center-tapped potentiometer. Terminal 16a corresponds to the center-tap of the potentiometer. Impedance network 12a consists of a plurality of two terminal impedance elements 32 connected in series. Impedance elements 32 are preferably temperature compensated resistors. A node 33 is provided between each pair of impedance elements 32 in the series chain. The first element in the series chain is connected to a first terminal 14a which is accessible for connection to the external circuit. This terminal is analogous to terminal 14 shown in FIG. 1. Similarly, the last element in the series chain is connected to a second terminal 28a which is accessible for connection to said external circuit. Each of the nodes 33 may be connected to the third terminal 16a which is also accessible for connection to said external circuit. Terminal 16a is analogous to terminal 16 shown in FIG. 1. Only one of the nodes 33 can be connected to third terminal 16a at a given time. The node which is connected is specified by the value stored in counter 18 which has been omitted from FIG. 2. This value is coupled to a 1-of-N decode circuit 36, the outputs of which control a plurality of switches 38. Here, N is the maximum value which may be stored in counter 18. There are N nodes 33, each node corresponding to a given counter value. Each node 33 may be coupled to terminal 16a by applying a signal to the corresponding switch 38.

The main problem with impedance network 12a is the number of impedance elements 32 which must be used to construct the network. For example, if a thousand impedance steps are needed, a thousand resistors must be provided. In the preferred embodiment, the variable impedance circuit of the present invention is constructed on a single silicon chip using conventional VLSI circuit fabrication methods. The cost of such a circuit is related to the area of silicon needed to construct the circuit. Hence, minimizing the number of circuit elements needed is highly desirable. In addition, there are a number of applications for a variable impedance circuit in which the relationship between the value stored in counter 18 and the impedance generated between terminals 14 and 16 is preferably nonlinear.

The present invention provides solutions to these problems by providing variable impedance networks which require fewer impedance elements and which provide impedances which have specific nonlinear relationships to the value stored in counter 18. The method by which this is accomplished is best understood with reference to the following alternate preferred embodiments.

Figure 3:
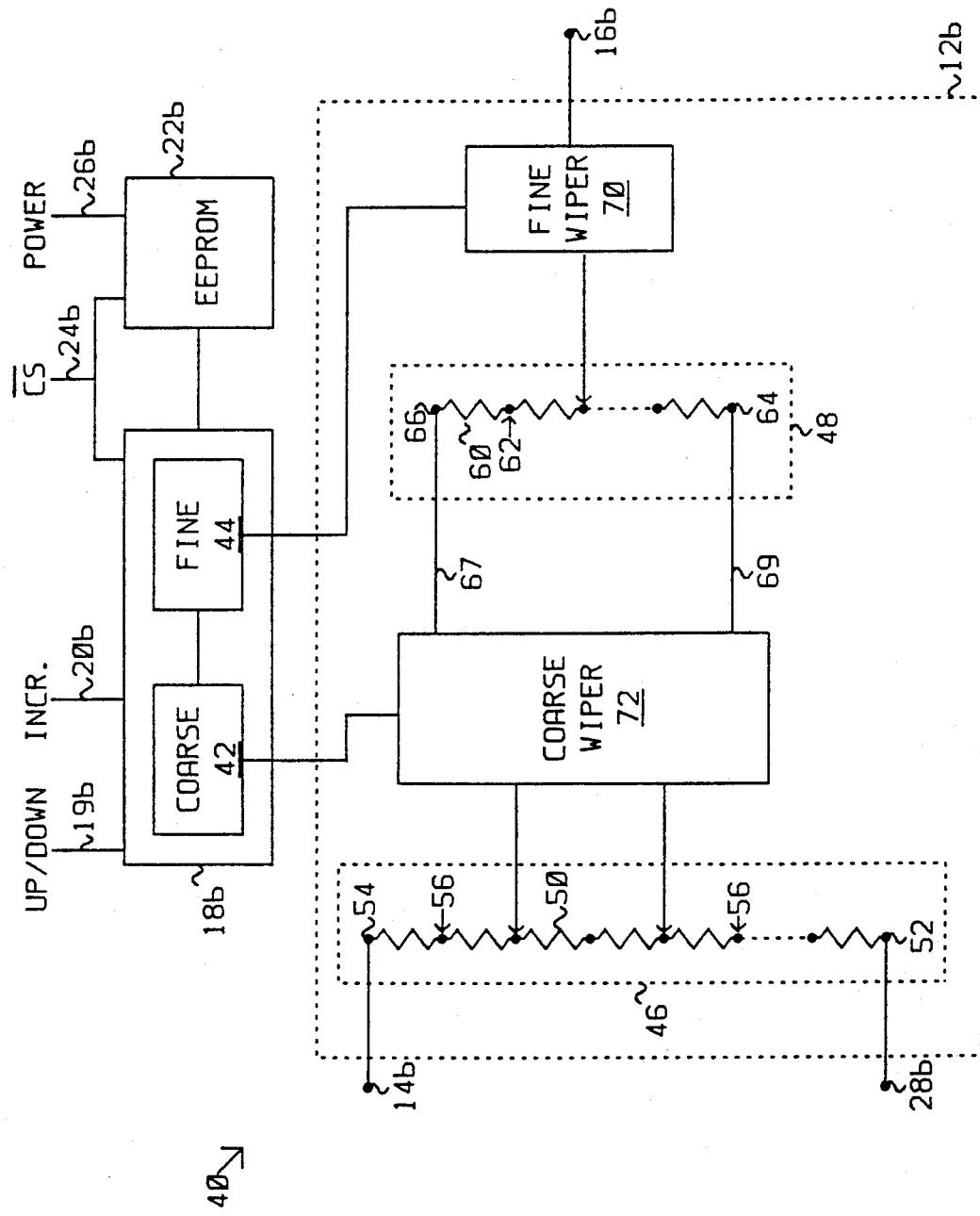
FIG. 3 is a schematic diagram of a variable impedance circuit according to the present invention in which the impedance network is organized as a coarse-fine impedance circuit.

EMBODIMENT ONE:

The first alternate circuit is shown in FIG. 3 at 40. This circuit is analogous to the variable impedance circuit shown in FIG. 2 in that it provides an impedance which is a linear function of the value stored in counter 18. However, it provides this function with far fewer impedance elements and switches than the embodiment shown in FIG. 2. Variable impedance circuit 40 is also analogous to a conventional linear potentiometer.

Referring to FIG. 3, variable impedance circuit 40 includes a counter 18b which stores a value in two registers which are referred to as coarse register 42 and fine register 44. Coarse register 42 counts from 0 to $N_c - 1$ and is incremented or decremented each time fine register 44 overflows or underflows, respectively. Fine register 44 counts from 0 to $N_f - 1$ and is incremented or decremented in response to a signal on an input INCR. line 20b. Whether fine register 44 is incremented or decremented is determined by the UP/-DOWN signal on a second line 19b in a manner analogous to that described above with reference to FIG. 1. Registers 42 and 44 in effect form a two "digit" counter in which the first "digit" has a radix of $N_f$ and the second "digit" has a radix of $N_c$.

The values stored in registers 42 and 44 may be transferred to or from a programmable read only memory (EEPROM) 22b in response to predetermined voltage transitions on lines 24b and 26b which operate in an analogous manner to lines 24 and 26 shown in FIG. 1.

The variable impedance element 40 includes an impedance network 12b which consists of two series impedance strings, coarse impedance string 46 and fine impedance string 48 and two "wiper" circuits, coarse wiper circuit 72 and fine wiper circuit 70. Coarse impedance string 46 consists of $N_c + 1$ two terminal impedance elements 50 connected in series. Each impedance element in coarse impedance string 46 has an impedance of Z. An internal node 56 connects adjacent impedance elements 50 in the series string. The terminals 52 and 54 of the first and last impedance elements 50, respectively, which are not connected to an internal node, are connected to external terminals 14b and 28b. In order to simplify the discussion of the operation of variable element 40, the nodes in the coarse impedance string 46 are numbered in order from 0 to $N_c + 1$ starting with node 52 and ending with node 54. Node 52 will be referred to as the "0th" node.

Similarly, fine impedance string 48 consists of a series string of two terminal impedance elements 60. There are $N_f$ such impedance elements. The adjacent elements in fine impedance string 48 are connected at internal nodes 62. The terminals 64 and 66 of the first and last impedance elements 60, respectively, which are not connected to an internal node 62, are connected to coarse wiper circuit 72, via first and second output terminals 67 and 69, which connects these two terminals to two selected nodes in coarse impedance string 46.

The impedance of each impedance element 60 is chosen to be equal to $2Z/N_f$. This choice of impedance for each impedance element 60 results in the impedance between terminals 14b and 16b being a linear function of the count in counter 18b. This choice also results in the impedance between terminals 14b and 28b remaining constant independent of the value stored in counter 18b, the impedance in question being equal to $N_cZ$. That is, the selected parallel combination of two course elements and two fine elements is equivalent to the resistance of one course element in the chain.

In a manner similar to that described with reference to the coarse impedance string 46, the nodes in the fine impedance string 48 are numbered in order from 0 to $N_f$ starting with node 64 and ending with node 66. Node 64 will be referred to as the "0th" node. Fine wiper circuit 70 connects one of these nodes to external terminal 16b. The node in question is determined by the count in fine register 44, the Kth such node being connected when fine wiper circuit 44 has the value K stored therein.

The nodes in coarse impedance string 46 which are connected by coarse wiper circuit 72 to nodes 64 and 66 in the fine impedance string 48 are determined by the value stored in coarse register 42. When the value so stored is L, coarse wiper circuit 72 connects the (L+2)th node of coarse impedance string 46 to node 66 in the fine impedance string 48 and the Lth node of coarse impedance string 46 to node 64 in fine impedance string 48.

Figure 4:
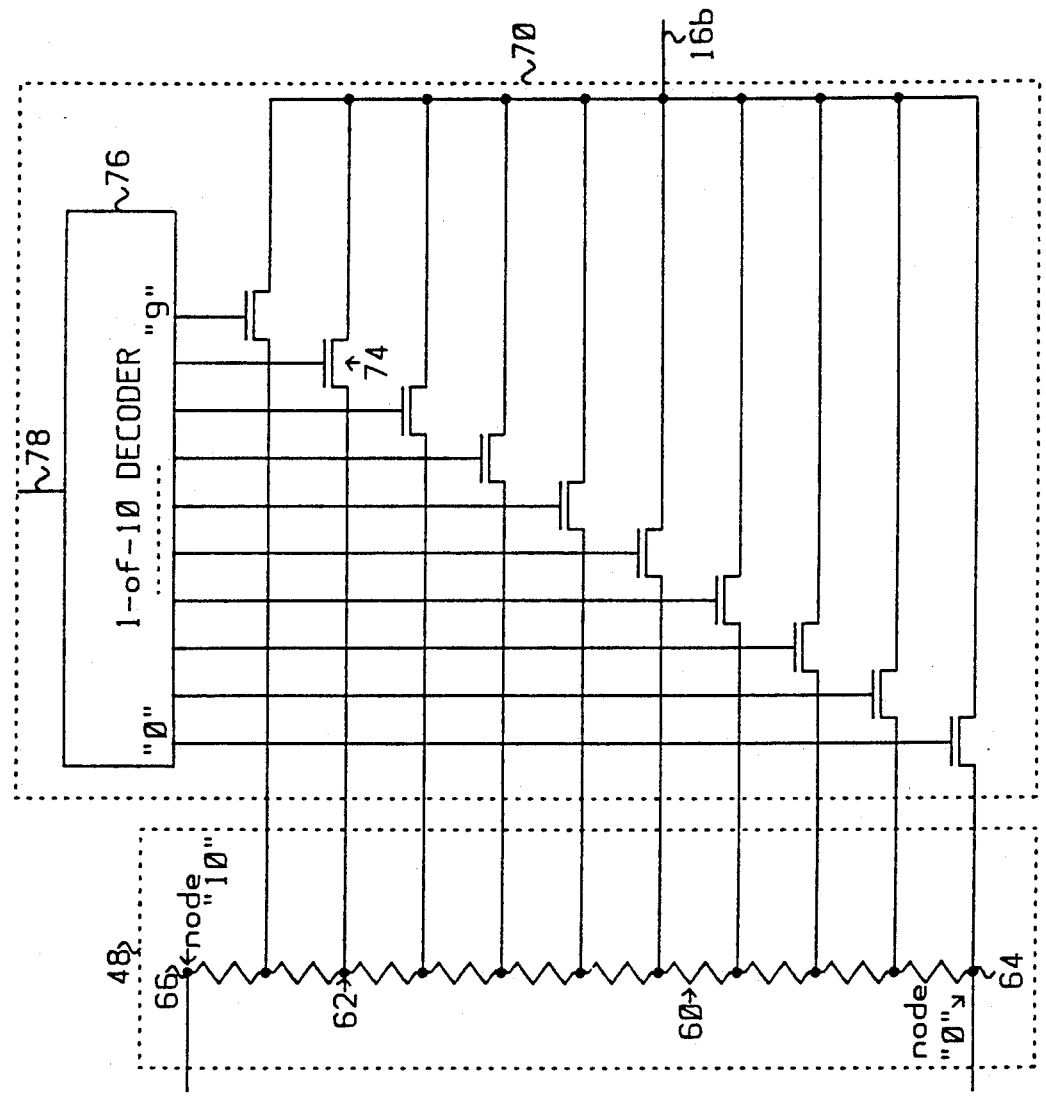
FIG. 4 is a schematic diagram of the fine wiper circuit shown in FIG. 3 for the case in which $N_f$ is 10.
Figure 5:
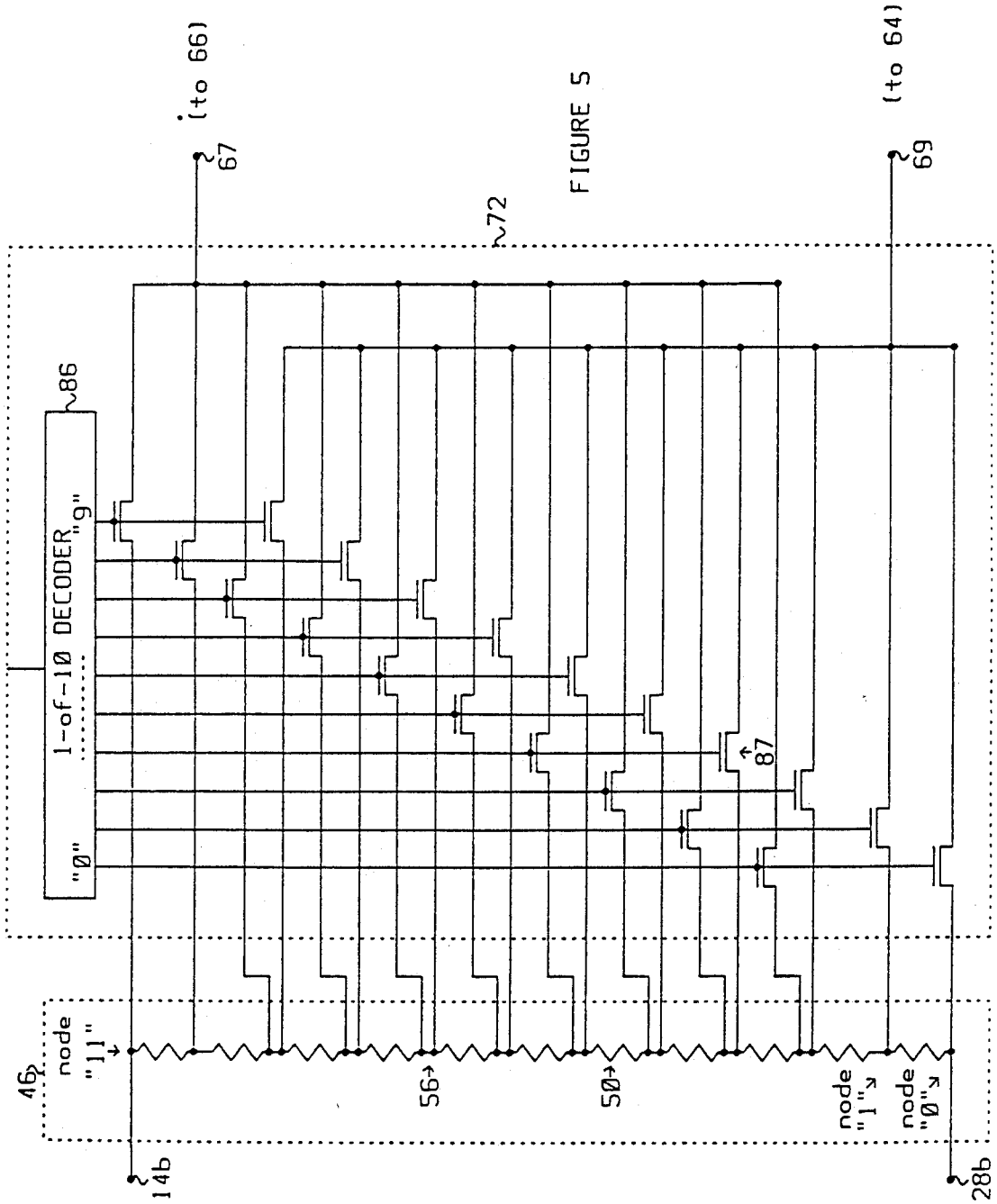
FIG. 5 is a schematic diagram of the coarse wiper circuit shown in FIG. 3 for the case in which $N_c$ is 10.

The manner in which fine wiper circuit 70 and coarse wiper circuit 72 are constructed can be most easily understood with reference to FIGS. 4 and 5 which are schematic diagrams of a fine wiper circuit 70 and a coarse wiper circuit 72, respectively, in the case in which $N_c$ and $N_f$ are each equal to ten. In this case, counter 18b would be a two decade binary coded decimal counter. The coarse register 42 would correspond to the most significant digit of the counter and the fine register 44 would correspond to the least significant digit.

Referring now to FIG. 4, fine impedance string 48 consists of ten impedance elements 60 connected at nodes 62 which are labeled from 0 to 10. Nodes "0" through "9" may be connected to terminal 16b by closing one of the FET switches 74. Terminal 16b serves the same function as terminal 16b shown in FIG. 3. The FET switches 74 are controlled by the outputs of the 1-of-10 binary coded decimal decoder 76. Decoder 76 is controlled, in turn, by the output 78 of least significant digit register 44 of a two decade counter corresponding to counter 18b shown in FIG. 3. It is obvious that although output 78 of register 44 is shown as a single line, the actual number of lines would need to be four for a conventional such binary decade counter. When the least significant digit output by register 44 is K, the Kth node output line of decoder 76 will be active. This will result in the Kth node 62 of fine impedance string 48 being coupled to terminal 16b by the corresponding FET switch.

Referring now to FIG. 5, coarse impedance string 46 consists of 11 impedance elements 50 connected at nodes 56 which are labeled 0 to 11. Coarse wiper circuit 72 consists of a binary coded decimal decoder 86 and 20 FET switches 87. The FET switches 87 are controlled by the outputs of the 1 of 10 binary coded decimal decoder 86. When active, each such output closes two of the FET switches 87. The first switch connects one of the nodes 56 to node 66 shown in FIG. 4. The second switch connects the node located two nodes below the node connected by the first switch to node 64 shown in FIG. 4. In a manner similar to that discussed with reference to decoder 76, above, decoder 86 is controlled by course register 42, which is incremented or decremented as a function of the overflow or underflow from the low order counter 44. When this most significant digit register 42 has the value K, node "K" is connected to node 64 and node "K+2" is connected to node 66.

As can be seen, therefore, with reference to FIGS. 3 and 5, a general coarse wiper circuit such as that shown in FIG. 3 at 72 is constructed by coupling switches between each node of the coarse impedance string 46 and either first output terminal 67 or second output terminal 69, or both. The output terminal in question is determined by the number of the node to which the switch is connected. In the case of nodes 0 and 1, one switch connects each node to output terminal 69. In the case of nodes $N_c+1$ and $N_c$ one switch connects each node to output terminal 67. All other nodes have 2 switches connected thereto, one connecting the node to output terminal 67 and one connecting the node to output terminal 69. The switches in question are controlled by the outputs of a 1-of-$N_c$ decoder. The Kth such output controls the switch connecting node K to output terminal 69 and the switch connecting node K+2 to output terminal 67.

It should be noted that this two decade variable impedance circuit 40 provides 100 impedance values while only requiring 21 impedance elements and 31 switches. An equivalent circuit constructed according to the embodiment shown in FIG. 2 requires 100 impedance elements and 100 switches. Hence, the present invention provides the same functionality using significantly fewer elements, thus requiring a significantly smaller area of silicon.

Figure 6:
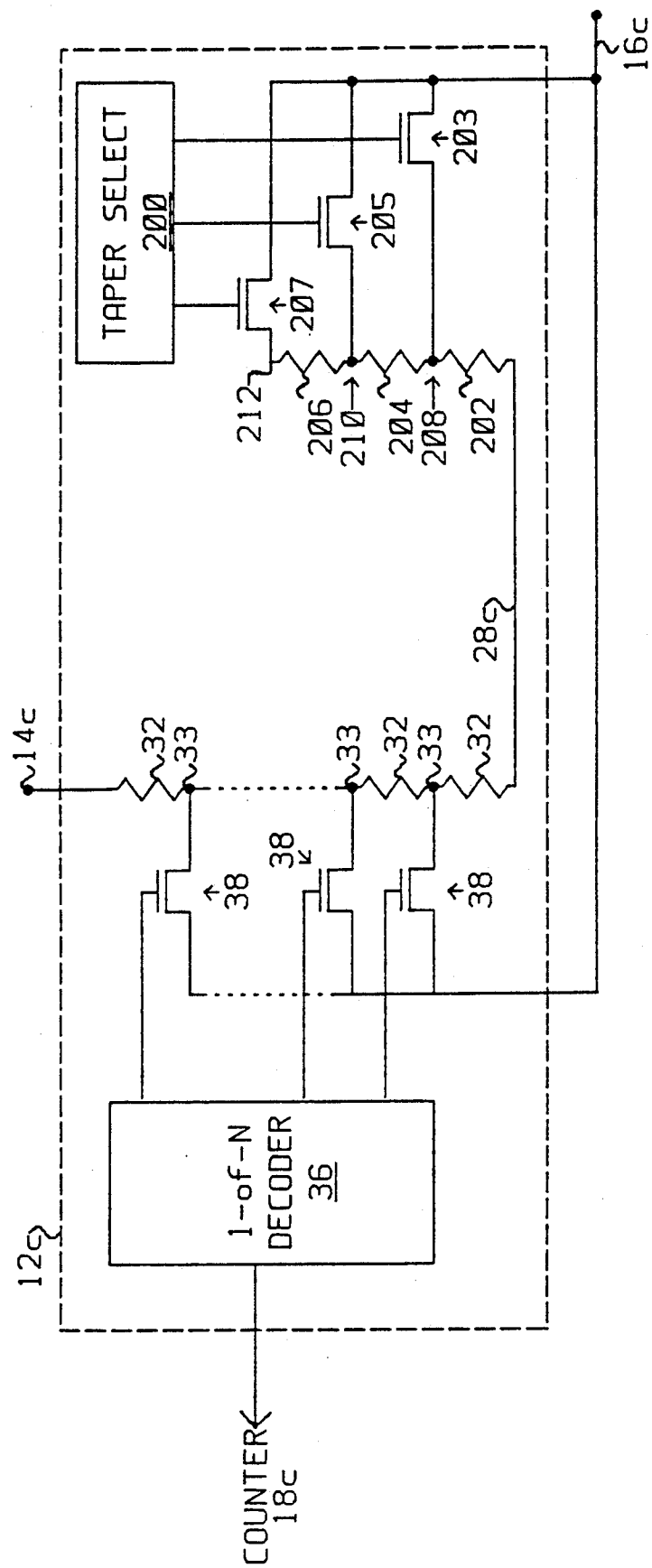
FIG. 6 is a schematic diagram of a variable impedance circuit according to the present invention in which the impedance network includes parallel fixed resistors for obtaining non-linear or tapered resistance characteristics.
Figure 7:
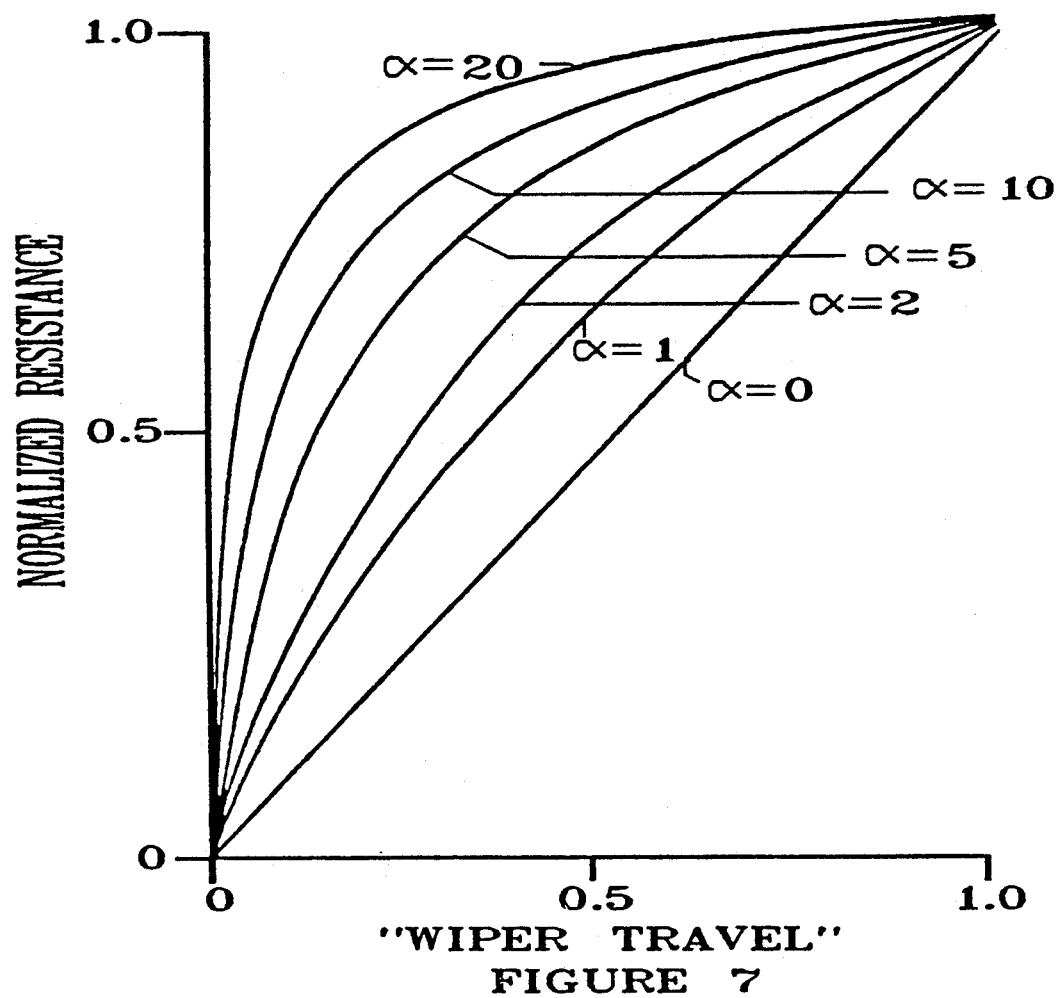
FIG. 7 is a graph of exemplary resistance curves as a function of wiper travel generated by a variable impedance circuit as shown in FIG. 6.

EMBODIMENT TWO:

A variable impedance circuit in which the impedance between terminals 14a and 16a provided by impedance network 12a shown in FIG. 2 is a nonlinear function of the value stored in counter 18 may be constructed by adding a fixed impedance between terminal 28a and terminal 16a. The degree of nonlinearity is determined by the ratio of this added taper impedance to the impedance between terminals 14a and 28a. An exemplary such impedance network 12c is shown in FIG. 6. FIG. 7 illustrates exemplary resistance curves as a function of the taper selected for the circuit shown in FIG. 6.

The fixed impedance in question could be added externally. However, significant advantages are obtained by constructing this fixed impedance on the same integrated circuit chip as variable impedance circuit 12a. In the preferred embodiment, impedance elements 32 are temperature compensated resistors and the fixed impedance element in question is also a temperature compensated resistor. If the fixed impedance element is integrated on the same VLSI circuit chip, it can be precisely matched to impedance elements 32, which assures that the resultant non-linear variable impedance circuit will have a very small impedance variation if the operating temperature is varied. Hence, integration of said fixed impedance is preferred.

As illustrated in FIG. 6, various degrees of nonlinearity may be provided by integrating several different fixed impedance elements e.g., elements 202, 204, and 206, on the same chip with the rest of impedance network 12c. One terminal of each such impedance element would be connected to terminal 28c, corresponding to terminal 28a in FIG. 2. The other terminal of each fixed impedance element could be connected to an external pin on the integrated circuit package, a different pin being used for each fixed impedance element. The choice of which fixed impedance element is connected between terminals 14b and 28c could then be made by the user by connecting a jumper between a particular pin and terminal 14b.

As seen in FIG. 6, preferably each fixed resistor 202, 204 and 206 is connected in series. The node 208 between resistors 202 and 204, the node 210 between resistors 204 and 206, and terminal 212 on the opposite side of impedance element 206 from node 210 are each connected to respective FET switches 203, 205 and 207. Thus, a taper select means 200 is used to actuate one of FET switches 203, 205 or 207 to cause different predetermined fixed impedances to exist between terminals 28c and 16c. Taper select 200 thus varies the taper impedance of the impedance circuit 12c.

For example, assume the impedance elements 32 enable a 10 kilohm variable impedance element to be generated using 100 separate 100 ohm resistors. Assume also that impedance element 202 is a 500 ohm resistor, impedance element 204 is a 1 kilohm resistor and impedance element 206 is a 2 kilohm resistor. Such a circuit enables selection of tapers equal to 20, 10 and 5, respectively. FIG. 7 illustrates the resultant nonlinear characteristics of the resistance curve for such tapers as a function of wiper travel, i.e. as a function of which node 33 is connected to terminal 16c. For comparison purposes, FIG. 7 also illustrates the condition where the taper equals zero, corresponding to a variable impedance circuit with no taper resistances 202, 204 and 206 in series therewith.

Taper select 200 can be implemented to provide controlled switching of switches 203, 205 and 207. For example, the N-2, N-1 and N outputs of decoder 36 could be coupled to switches 203, 205 and 207, respectively, to provide this function. In such an arrangement, the taper select state would also be retained in the programmable read-only memory 22 in the same manner as described for the impedance circuit of FIG. 1. Alternatively, separate external control of taper select 200 would be within the ordinary skill of the art.

Figure 8:
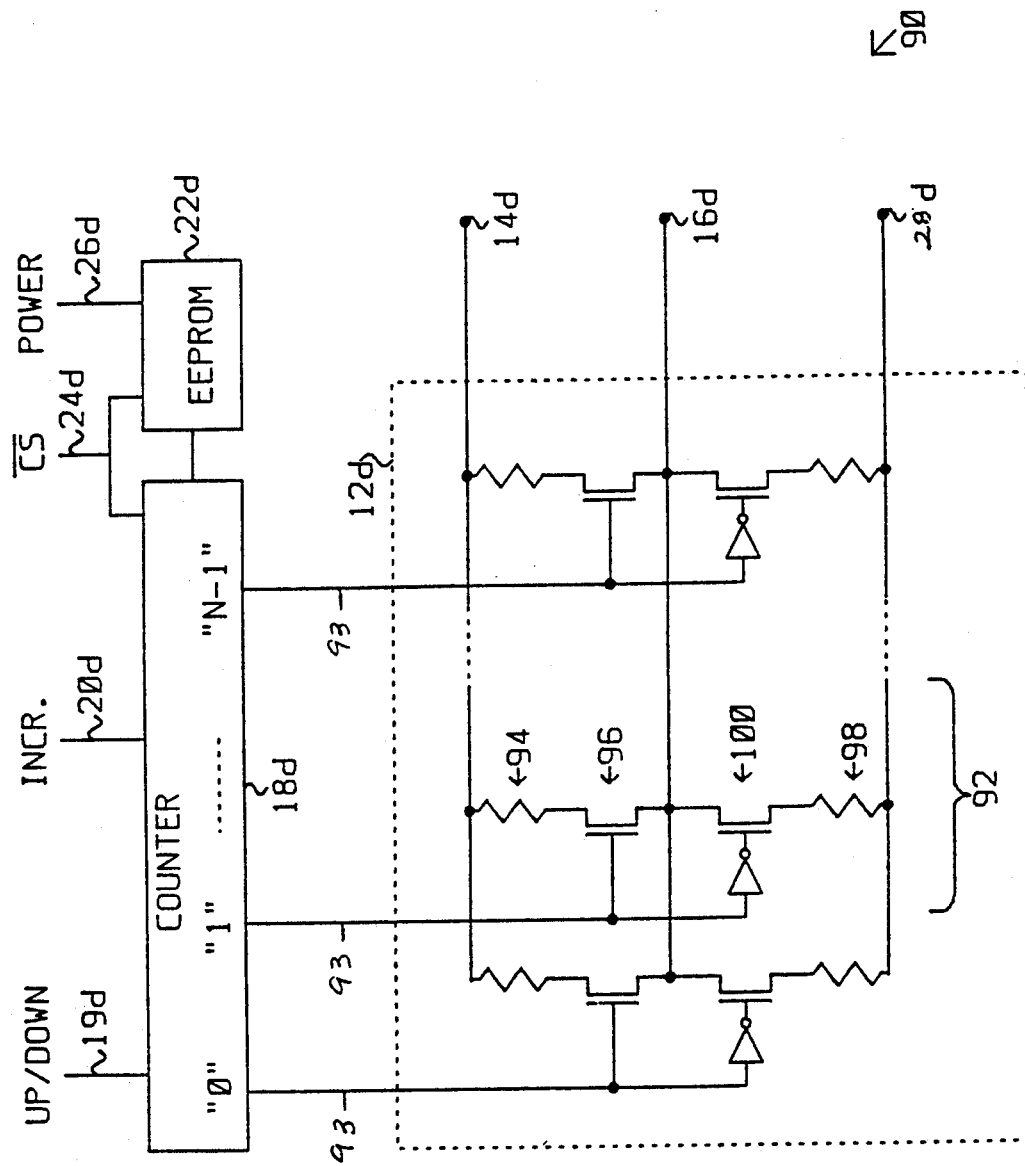
FIG. 8 is a schematic diagram of a variable impedance circuit according to the present invention in which the impedance network comprises a first binary weighted impedance array.

EMBODIMENT THREE:

Another alternative non-linear variable impedance circuit is shown in FIG. 8 at 90. In this embodiment of the present invention, a binary counter 18d is used to control a parallel, binary weighted impedance network 12d. The value stored in binary counter 18d may be transferred to and from a programmable read only memory 22d in response to signals on lines 24d and 26d in a manner analogous to that described above with reference to FIG. 1. The count stored in binary counter 18d may be altered by appropriate signals on lines 19d and 20d in a manner analogous that described with reference to FIG. 1.

For the purposes of this discussion, it will be assumed that binary counter 18d has N bits and these bits are available on output lines which are labeled "0" to "N−1" in FIG. 8; the labels in question being assigned in order of significance of the bits in question. Impedance network 12d consists of N impedance circuits of which impedance circuit 92 is typical. Each impedance circuit 92 is controlled by a corresponding output line 93 from binary counter 18d.

Each impedance circuit 92 consists of two impedance elements 94 and 98 having equal impedances and two FET switches 96 and 100. FET switch 96 couples impedance element 94 between terminals 14d and 16d when the corresponding output line of binary counter 18d is active. FET switch 100 couples impedance element 98 between terminals 28d and 16d when the output line in question is inactive. In general, the impedance of the impedance element 94 coupled to the Kth output line of binary counter 18d is $2^K Z$, where Z is the impedance of the impedance element 94 coupled to the 0th output line of binary counter 18d. In the preferred embodiment, each of the impedance elements 94 and 98 are temperature compensated resistors.

Variable impedance circuit 90 provides fine resolution with far less resistors and FET switches than does a variable impedance circuit based on the impedance network shown in FIG. 2. With a nine bit binary counter 18d, 122 resistors FET switches provide 512 impedance values in circuit 90. If the impedance network shown in FIG. 2 were used, 512 resistors and 512 FET switches would be needed to implement a variable resistor having the same resolution.

Figure 9:
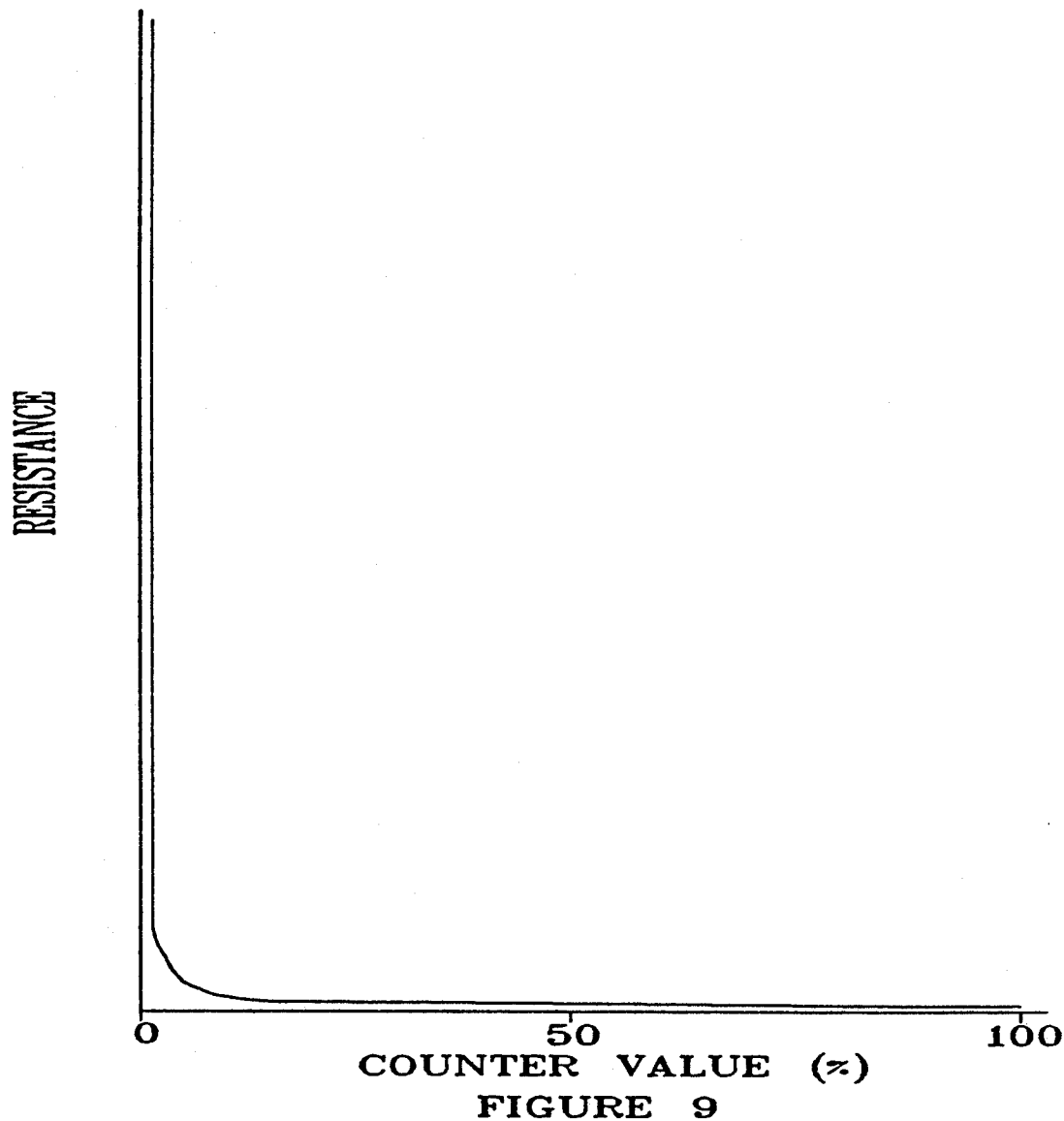
FIG. 9 is a graph of the resistance versus counter value for the first binary weighted impedance array shown in FIG. 8.

Variable impedance circuit 90 has a very non-linear impedance when viewed as a function of the value stored in binary counter 18d. FIG. 9 is a graph of the resistance versus counter value for variable impedance circuit 90. As can be seen in FIG. 9, variable impedance element 90 has very fine resolution at low impedance values. In the case of a nine bit binary counter and Z=50 ohms, this circuit provides 0.2 ohm resolution at a 50 ohm nominal impedance setting. This type of variable impedance element may be used as a fine "trim" potentiometer which would normally be placed in series with a small fixed impedance.

Figure 10:
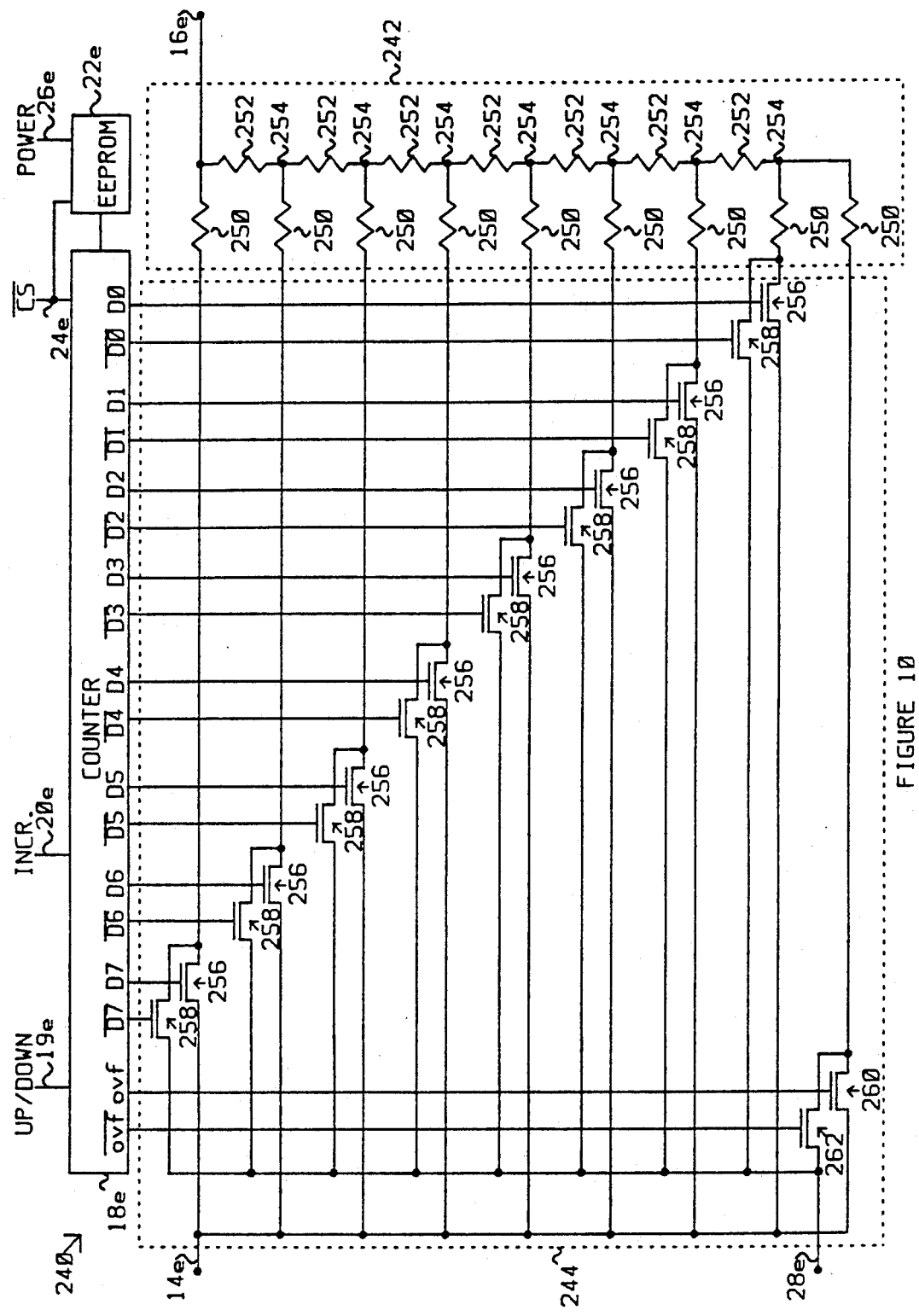
FIG. 10 is a schematic diagram of a variable impedance circuit according to the present invention in which the impedance array comprises a second binary weighted impedance array.

EMBODIMENT FOUR:

Another alternative linear variable impedance circuit is shown in FIG. 10 at 240. In this embodiment of the present invention, a binary counter 18e is used to control a conventional 1R-2R type impedance ladder circuit shown at 242. The impedance seen by wiper 16e is a function of a switching network 244, preferably comprising a plurality of FET switches 256, 258 which are driven by a binary counter 18e. As seen, for proper operation of 1R-2R network 242, for each given output line $D_x$, if the FET switch 256 tied to $D_x$ is on, the FET switch 258 corresponding thereto is off, and vice versa.

In operation, as can be seen, wiper 16e always sees a constant 1R equivalent resistance as a function of the current state of counter 18e. At mid-scale, for example, this means that there is 2R to terminal 14e and 2R to terminal 28e yielding a thevenin equivalent resistance of 1R on terminal 16e. At either extreme, the 2R parallel 2R circuit equals a 1R equivalent resistance. A disadvantage of the 1R-2R ladder circuit is that the resistance between terminals 14e and 28e is not constant, in contrast with the impedance network shown at 12a in FIG. 2. In circuit 240, the resistance between terminals 14e and 28e will vary from 4R to infinity, depending on the state of the counter 18e. This means that the 1R-2R potentiometer must be driven from a low output impedance voltage source so that this variation in resistance will not effect operation of the impedance circuit 240. Consequently, circuit 240 is not as useful in applications where a constant resistance end-to-end is needed to "balance" a signal load, such as in a bridge circuit or in differential circuits.

Variable impedance circuit 240 provides the best resolution with the fewest number of resistors and switches. The configuration shown in FIG. 10 for example, uses 16 switches and 16 impedance elements to achieve a resolution of one out of 256. In this configuration, the voltage on terminal 28e will be equal to or less than the voltage on terminal 16e, which will be equal to or less than 255 divided by 256 times the voltage at terminal 14e. Two FET switches 260 and 262 may be added to the lowest order 2R resistor 250 and be controlled by the overflow and overflow outputs of binary counter 18e, to achieve a voltage on terminal 28e equal to or less than the voltage on terminal 16e equal to or less than the voltage on terminal 14e.

Accordingly, an improved variable impedance element has been described. Various modifications in addition to those described above will readily be apparent to those skilled in the art. For example, other impedance networks can be used in practicing the present invention. The scope of the present invention is therefore defined only by the following appended claims.

What is claimed is:

1. A variable impedance circuit which provides a specified electrical impedance between first and second terminals, said variable impedance circuit comprising:
    impedance controlling means for controlling the electrical impedance between said first and second terminals, said impedance controlling means including input means for receiving electrical signals specifying the impedance between said first and second terminals and first storage means for storing a value representative of said specified impedance;
    variable impedance network means responsive to the value stored in said first storage means for setting the impedance between said first and second terminals;
    second storage means for storing the value stored in said first storage means in response to a first electrical storage signal, the value stored in said second storage means remaining therein in the absence of electrical power;
    means for causing the value stored in said second storage means to be stored in said first storage means in response to a second electrical storage signal; and
    control means coupled to said input means for changing the value stored in said first storage means.

2. The variable impedance circuit of claim 1 wherein said input means comprises:
    means for receiving an increment signal including means for changing the value stored in said first storage means by a predetermined amount in response to the receipt thereof; and
    means for receiving a directional control signal having a first value indicating that the value stored in said first storage means is to be incremented by said predetermined amount in response to said increment signal and a second value indicating that said stored number is to be decremented by said predetermined amount in response to said increment signal.

3. The variable impedance circuit of claim 2 wherein said input means further comprises means for receiving a chip select signal and wherein said first electrical storage signal comprises a first predetermined change in the voltage of said chip select signal.

4. The variable impedance circuit of claim 3 wherein said means for receiving an increment signal is inoperative in the absence of said chip select signal.

5. The variable impedance circuit of claim 2 wherein said input means further comprises means for detecting when power is applied to said variable impedance circuit and means responsive to said detection means for generating said second electrical signal.

6. The variable impedance circuit of claim 1 wherein said first storage means comprises counting means for specifying one of a predetermined number of states equal to N, said input means comprising:
    means for receiving a directional control signal having a first value indicating that the current state of said counting means is to be incremented by one count and a second value indicating that the current state of said counting means is to be decremented by one count; and
    means for receiving an increment signal for causing the current state of said counting means to either be incremented or decremented said one count as a function of the current state of said directional control signal.

7. The variable impedance circuit of claim 1 wherein said first storage means comprises coarse register means for storing a value between 0 and $N_c-1$ and fine register means for storing a value between 0 and $N_f-1$, wherein $N_c$ and $N_f$ are predetermined integer values greater than one, and
    wherein said variable impedance network means comprises:
    a third terminal;
    coarse impedance means including $N_c+1$ two terminal impedance elements connected in series, adjacent said impedance elements being connected at internal nodes, the terminal of said first impedance element which is not connected to an internal node being connected to said third terminal at a first external node and the terminal of said last impedance element which is not connected to an internal node being connected to said first terminal at a second external node, said internal and external nodes being numbered in order from 0 to $N_c+2$ starting with the external node coupled to said third terminal;
    fine impedance means including $N_f$ two terminal impedance elements connected in series, adjacent said impedance elements being connected at internal nodes, the terminal of said first impedance element which is not connected to an internal node being connected to a first wiper terminal at a first internal connection node and the terminal of said last impedance element which is not connected to an internal node being connected to a second wiper terminal at a second internal connection node, said internal and external nodes being numbered in order from 0 to $N_c+1$ starting with the external node coupled to said second internal connection node;
    coarse wiper means coupled to said coarse register means for coupling two of said nodes of said coarse impedance means to said first and second internal connection nodes of said fine impedance means in response to the value stored in said coarse register means, said first internal connection node being coupled to the (K+2)th node of said coarse impedance means and said second internal connection node being coupled to the Kth node of said coarse register means when the value stored in said coarse register means is equal to the number K; and
    fine wiper means coupled to said fine register means for coupling a node in said fine impedance means to said second terminal in response to the value stored in said fine register means, the Lth said node being so coupled when the value stored in said fine register is equal to the number L.

8. The variable impedance circuit of claim 7 wherein said fine register means comprises an up/down counter which is incremented or decremented in response to predetermined electrical signals, said up/down counter having a maximum count of $N_f-1$ and a minimum count of 0, said counter generating an overflow signal when said counter is incremented and said counter contains said maximum count and said counter generating an underflow signal when said counter is decremented and said counter contains said minimum count, and
wherein said coarse register means comprises an up/down counter coupled to said fine register means, said up/down counter being incremented in response to said overflow signal and decremented in response to said underflow signal, said up/down counter having a maximum count of $N_c-1$ and a minimum count of 0.

9. The variable impedance circuit of claim 8 wherein said fine wiper means comprises:
a 1-of-$N_f$ decode circuit coupled to said fine register means, said decode circuit including $N_f$ output lines, only one said output line having a signal thereon at any given time, said output lines being numbered from 0 to $N_f-1$;
$N_f$ switch means for coupling nodes in said fine impedance means to said second terminal, one said switch means corresponding to each node in said fine impedance means having a number less than or equal to $N_f$, each said switch means being connected to the output line of said 1-of-$N_f$ decoder circuit bearing the same number as the node to which said switch means corresponds, each said switch means coupling the node to which said switch means corresponds to said second terminal if a signal is present on the said output line to which it is connected.

10. The variable impedance circuit of claim 8 wherein said coarse wiper means comprises:
a 1-of-$N_c$ decode circuit coupled to said coarse register means, said decode circuit including $N_c$ output lines, only one said output line having a signal thereon at any given time, said output lines being numbered from 0 to $N_c-1$;
a plurality of first switch means for coupling nodes in said coarse impedance means to said first internal connection node, one said switch means corresponding to each node in said fine impedance means having a number greater than 1 and less than or equal to $N_c+2$, each said switch means being connected to the output line of said 1-of-$N_f$ decoder circuit having a number equal to K-2, where K is the number of the node to which said switch means corresponds, each said switch means coupling the node to which said switch means corresponds to said first internal connection node if a signal is present on the said output line to which it is connected; and
a plurality of second switch means for coupling nodes in said coarse impedance means to said second internal connection node, one said switch means corresponding to each node in said fine impedance means having a number less than $N_c-1$, each said switch means being connected to the output line of said 1-of-$N_f$ decoder circuit having the same, number as the number of the node to which said switch means corresponds, each said switch means coupling the node to which said switch means corresponds to said second internal connection node if a signal is present on the said output line to which it is connected.

11. The variable impedance circuit of claim 8 wherein the impedance of each two terminal impedance element in said coarse impedance means is equal to Z and wherein the impedance of each two terminal impedance element in said fine impedance means is equal to $2Z/N_f$.

12. The variable impedance circuit of claim 11 wherein said two terminal impedance elements are resistors.

13. The variable impedance circuit of claim 1 wherein said first storage means comprises register means having a plurality of output lines equal to N, each said output line having two states, true and false, and wherein said variable impedance network comprises:
a third terminal;
a plurality of impedance circuits, each said impedance circuit being coupled to one of said output lines, each said impedance circuit comprising first and second two terminal impedance elements and first and second switch means, said first switch means coupling said first impedance element between said first and second terminals if and only if the state of the output line coupled to said impedance circuit is true, and said second switch means coupling said second impedance element between said second and third terminals if and only if the state of the output line coupled to said impedance circuit is false.

14. The variable impedance circuit of claim 13 wherein said first and second two terminal impedance elements have the same impedance, said impedance being a function of the output line coupled to the impedance circuit containing said first and second two terminal impedance elements.

15. The variable impedance circuit of claim 14 wherein said output lines are numbered from 0 to $N-1$ and wherein the impedance of said first and second two terminal impedance elements is proportional to $2^k$, where k is the number of the line to which the impedance circuit containing said first and second two terminal impedance elements is coupled.

16. The variable impedance circuit of claim 1 wherein said variable impedance circuit is contained on a single integrated circuit chip.

17. A variable impedance circuit which provides a specified electrical impedance between first and second terminals, said variable impedance circuit comprising:
impedance controlling means for controlling the electrical impedance between said first and second terminals, said impedance controlling means including input means for receiving electrical signals specifying the impedance between said first and second terminals and first storage means for storing a value representative of said specified impedance;
variable impedance network means responsive to the value stored in said first storage means for setting the impedance between said first and second terminals, said variable impedance network means comprising a first variable impedance network having first, second and wiper terminals, and including a plurality of impedance elements interconnected at a plurality of nodes so as to create a fixed impedance between said first and second terminals, one terminal of at least one of said impedance elements connected to said first terminal and one terminal of another one of said impedance elements connected to said second terminal, said wiper terminal selectively coupled to one of said nodes as a function of said impedance controlling means; and second variable impedance network means having third and fourth terminals, said third terminal being connected to one of said first and second terminals, said fourth terminal being connected to said wiper terminal, said second network means including a plurality of series connected impedance elements and having a node between each pair of impedance elements, said third terminal being connected to the first said impedance element which is not connected to a said node, means for coupling a selected one of said nodes, or the terminal of the last impedance element in said series which is not connected to a said node, to said wiper terminal, said coupling means being controlled by said impedance controlling means;

second storage means for storing the value stored in said first storage means in response to a first electrical storage signal, the value stored in said second storage means remaining therein in the absence of electrical power; and means for causing the value stored in said second storage means to be stored in said first storage means in response to a second electrical storage signal.

18. A variable impedance circuit which provides a specified electrical impedance between first and second terminals, said variable impedance circuit comprising:

impedance controlling means for controlling the electrical impedance between said first and second terminals, said impedance controlling means including input means for receiving electrical signals specifying the impedance between said first and second terminals and first storage means for storing a value representative of said specified impedance;

variable impedance network means responsive to the value stored in said first storage means for setting the impedance between said first and second terminals, said variable impedance network means comprising a ladder network including a 1R-2R type resistor ladder circuit of N stages, each having an input 2R resistor and an output 1R resistor, said impedance controlling means including means for selectively coupling said first terminal to a selected first one of said input resistors and for coupling said second terminal to a second selected one of said input resistors;

a third terminal connected to one of said output resistors;

second storage means for storing the value stored in said first storage means in response to a first electrical storage signal, the value stored in said second storage means remaining therein in the absence of electrical power;

means for causing the value stored in said second storage means to be stored in said first storage means in response to a second electrical storage signal; and control means coupled to said input means for changing the value stored in said first storage means.

* * * * *